United States Patent
Lai et al.

(10) Patent No.: US 6,458,643 B1
(45) Date of Patent: Oct. 1, 2002

(54) METHOD OF FABRICATING A MOS DEVICE WITH AN ULTRA-SHALLOW JUNCTION

(75) Inventors: Han-Chao Lai, Tai-Chung; Tao-Cheng Lu, Kao-Hsiung Hsien; Hung-Sui Lin, Hsin-Ying, all of (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/681,984

(22) Filed: Jul. 3, 2001

(51) Int. Cl.[7] .................... H01L 21/8238; H01L 21/336
(52) U.S. Cl. .................. 438/231; 438/301; 438/303
(58) Field of Search ............... 438/199, 223, 438/229, 230, 231, 301, 303, 305, 592, 596

(56) References Cited

U.S. PATENT DOCUMENTS

| | | | | |
|---|---|---|---|---|
| 4,801,555 A | * | 1/1989 | Holly et al. | 437/29 |
| 6,258,682 B1 | * | 7/2001 | Tseng | 438/305 |
| 6,265,255 B1 | * | 7/2001 | Hsien | 438/199 |
| 6,323,077 B1 | * | 11/2001 | Guo | 438/231 |

* cited by examiner

Primary Examiner—John F. Niebling
Assistant Examiner—Walter L. Lindsay, Jr.
(74) Attorney, Agent, or Firm—Winston Hsu

(57) ABSTRACT

A semiconductor substrate is provided with at least a gate formed on the semiconductor substrate. A first ion implantation process is performed to form a pocket implant region within the semiconductor substrate beneath the gate. Following the first ion implantation process, a first rapid thermal annealing (RTA) process is immediately performed to reduce TED effects resulting from the first ion implantation process. Thereafter, a second implantation process is performed to form a source extension doping region and a drain extension doping region within the semiconductor substrate adjacent to the gate. A source doping region and a drain doping region are then formed within the semiconductor substrate adjacent to the gate. Finally, a second RTA process is performed to simultaneously activate dopants in the source extension doping region, the drain extension doping region, the source doping region and the drain doping region.

15 Claims, 6 Drawing Sheets

METHOD OF FABRICATING A MOS DEVICE WITH AN ULTRA-SHALLOW JUNCTION

BACKGROUND OF INVENTION

1. Field of the Invention

The present invention relates to a method of fabricating a MOS device with an ultra-shallow junction (USJ) extension region.

2. Description of the Prior Art

In a very large scale integration (VLSI) process, ion implantation in a doping process is the most common method used to control the quantity and distribution of dopants in a semiconductor wafer and decrease thermal budget. As dimensions of electrical elements become smaller, improvement of ion implantation focuses on fabrication of a shallow junction functioning as a source extension or a drain extension of a metal-oxide semiconductor (MOS) transistor with dimensions in the range of microns.

Please refer to FIG. 1 to FIG. 5. FIG. 1 to FIG. 5 are schematic diagrams of a method of forming a MOS device with a shallow junction extension regionaccording to the prior art. As shown in FIG. 1, a semiconductor substrate 10 is provided. A dielectric layer 12, such as a silicon dioxide layer, is positioned on the surface of the semiconductor substrate 10 functioning as a gate oxide layer. Subsequently, a polysilicon layer (not shown) is deposited on the surface of the semiconductor substrate 10 followed by the use of a photolithographic and etching process to remove a portion of the polysilicon layer to form a gate 14. A chemical vapor deposition (CVD) is then performed to deposit a dielectric layer 16 of silicon nitride with a thickness of 500 to 2000 angstroms (Å) on the surface of the semiconductor substrate 10.

As shown in FIG. 2, a photoresist layer 18 is formed on the surface of the dielectric layer 16. Then, a planarization process is used to etch back a portion of the photoresist layer 18 down to the surface of the dielectric layer 16 atop the gate 14. As a result, the top surface of the remaining photoresist layer 18 on either side of the gate 14 aligns approximately with the top of the gate 14. As shown in FIG. 3, using the photoresist layer 18 as a mask layer, a dry etching process is performed to remove the dielectric layer 16 adjacent to the gate 14. After that, a first ion implantation process is performed to implant n-type dopants, such as arsenic ions, into both the gate 14 and the semiconductor substrate 10 not covered by the photoresist layer 18 with an implantation energy of approximately 70 KeV and an implantation dosage of approximately $1 \times 10^{13}/cm^2$. As a result, a pocket implant region 20 is formed within the semiconductor substrate 10 adjacent to the gate 14.

As shown in FIG. 4, after the photoresist layer 18 and the dielectric layer 16 are removed, a second ion implantation process is performed using p-type dopants, such as boron ions with an implantation energy of about 2 to 3 KeV and an implantation dosage of about $1 \times 10^{15}/cm^2$, thus forming a source/drain extension doping region 22 within the semiconductor substrate 10 adjacent to the gate 14. Then, a first rapid thermal annealing (RTA) is performed to activate both the pocket implant region 20 and the source/drain extension doping region 22.

As shown in FIG. 5, a dielectric layer such as an oxide layer or a silicon nitride layer (not shown) is uniformly deposited on the surfaces of the gate 14 and the semiconductor substrate 10. Thereafter, an anisotropic etching process is performed to etch back the dielectric layer as well as to form a spacer 24 by the remaining dielectric layer on either side of the gate 14. Following this, a third ion implantation process is performed still using p-type dopants, such as boron, with an implantation energy of about 5 KeV and an implantation dosage of about $1 \times 10^{15}/cm^2$ to form a source/drain doping region 26 within the semiconductor substrate 10 outside of the spacer 24. Finally, a second RTA process is performed to activate the dopants within the source/drain doping region 26 to finish the fabrication of the MOS device with the shallow junction extension regions.

In order to achieve the SIA-roadmap standard of the junction depth (the junction depth in a 0.1-micron process should be in the range of 200 to 400 Å), a decrease in the implantation energy of ion beams is required. While decreasing the implantation energy, a short channel effect (SCE) is thus prevented as a result of the increase in the integration of the electrical elements. However, decreasing the implantation energy results in a decrease in the beam current, which inevitably slows down the implantation rate to incur time delay and higher cost. In addition, except for a normal thermal diffusion, the high-energy ions implanted within the pocket implant region 20 occur a transient enhanced diffusion (TED) during the first RTA process, thus ineffectively decreasing the junction depth.

SUMMARY OF INVENTION

It is therefore an objective of the present invention to provide a method of fabricating a MOS device with an ultra-shallow junction (USJ) extension region.

It is another objective of the present invention to provide a method of fabricating a MOS device with an ultra-shallow junction (USJ) extension region to reduce transient enhanced diffusion (TED) effects.

According to the claimed invention, a semiconductor substrate is provided with at least a gate formed on the semiconductor substrate. A first ion implantation process is performed to form a pocket implant region within the semiconductor substrate beneath the gate. After the first ion implantation process, a first rapid thermal annealing (RTA) process is immediately performed to reduce TED effects resulting from the first ion implantation process. Thereafter, a second implantation process is performed to form a source extension doping region and a drain extension doping region within the semiconductor substrate adjacent to the gate. A spacer is then formed on either side of the gate followed by a third ion implantation process to form a source doping region and a drain doping region within the semiconductor substrate outside the spacer. Finally, a second RTA process is performed to simultaneously activate dopants in the source extension doping region, the drain extension doping region, the source doping region and the drain doping region.

As the first ion implantation process uses an implantation energy that is greater than the implantation energy of the second implantation process, the first RTA process is performed immediately after the first ion implantation process to activate ions within the semiconductor substrate and repair damages on the crystal lattice structure. As a result, TED effects and thermal diffusions of the high-energy ions in the pocket implant region are prevented from affecting the junction depth of the source extension and the drain extension.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
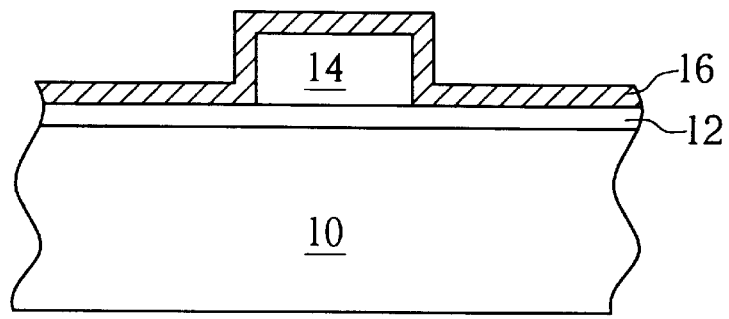
FIG. 1 to FIG. 5 are schematic diagrams of a prior art method of fabricating a MOS device with a shallow junction extension region.
Figure 2:
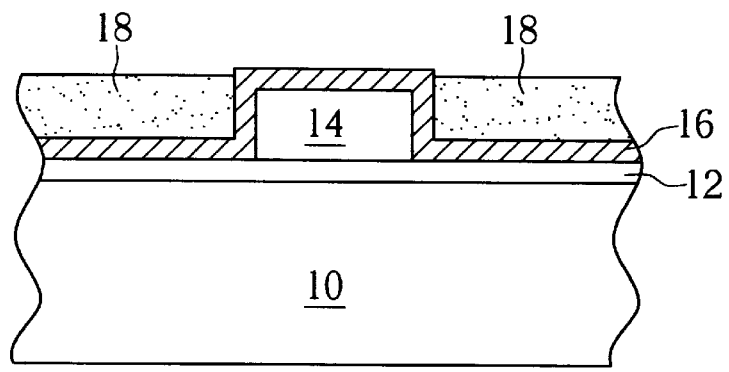
Figure 3:
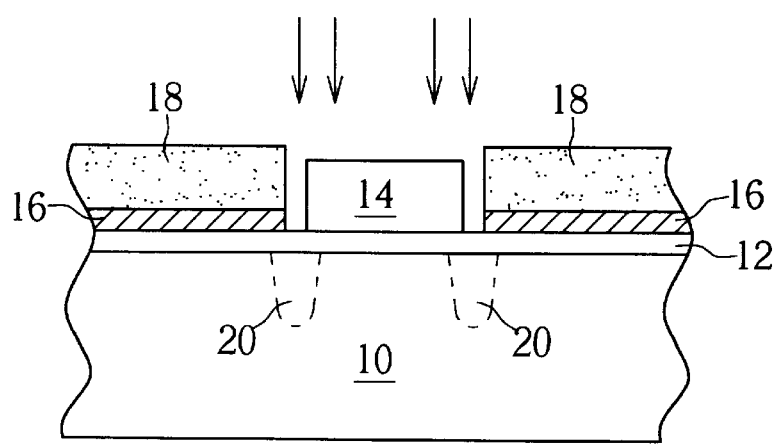
Figure 4:
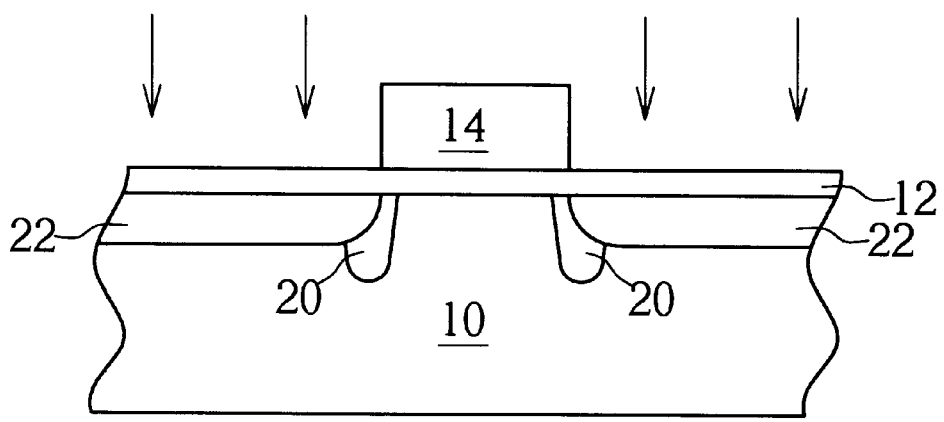
Figure 5:
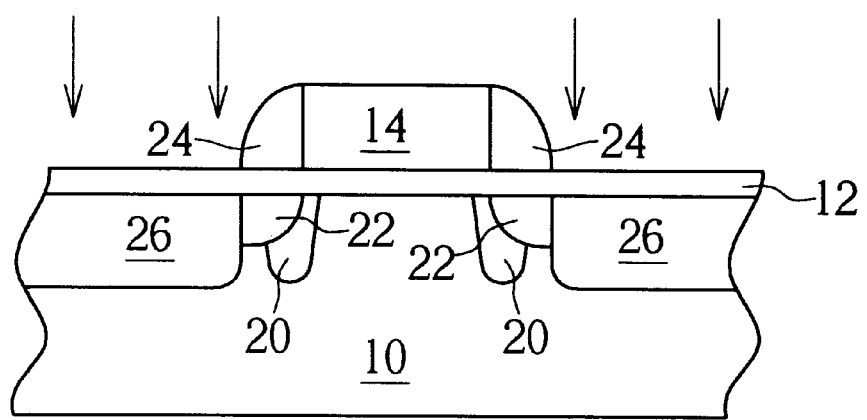
Figure 6:
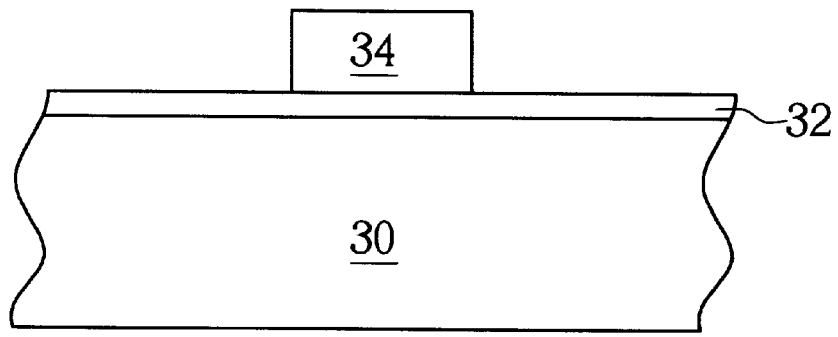
FIG. 6 to FIG. 9 are schematic diagrams of a method of fabricating a MOS device with an ultra-shallow junction extension region according to the present invention.

Please refer to FIG. 6 to FIG. 9. FIG. 6 to FIG. 9 are schematic diagrams of a method of fabricating a PMOS device with an ultra-shallow junction extension region according to the present invention. As shown in FIG. 6, a semiconductor substrate 30 is provided. A dielectric layer 32, such as a silicon dioxide layer, is positioned on the surface of the semiconductor substrate 30 functioning as a gate oxide layer. Subsequently, a polysilicon layer (not shown) is deposited on the surface of the semiconductor substrate 30 followed by the use of a photolithographic and etching process to remove a portion of the polysilicon layer to form a gate 34.

Figure 7:
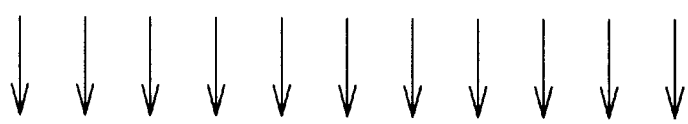
Figure 7:
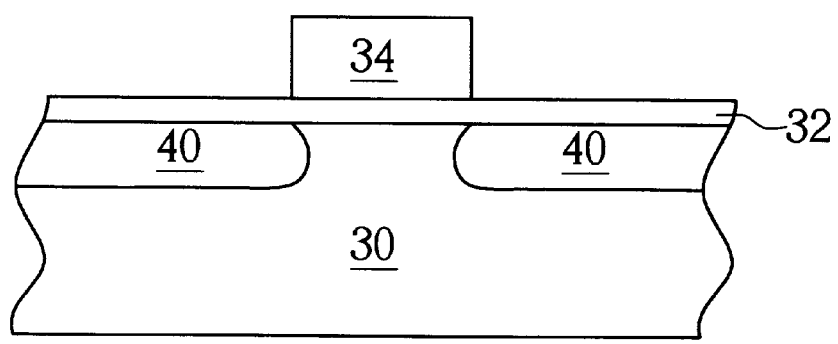

As shown in FIG. 7, a first ion implantation process is performed to implant n-type dopants, such as arsenic ions, into portions of the semiconductor substrate 30 not covered by the gate 34. An implantation energy of the first ion implantation process ranges between 60 and 80 KeV. A preferred value of the implantation energy of the first ion implantation process is 70 KeV. An implantation dosage of the first ion implantation process is approximately $1 \times 10^{13}/cm^2$. As a result, a pocket implant region 40 is formed within the semiconductor substrate 30 adjacent to the gate 34.

Figure 8:
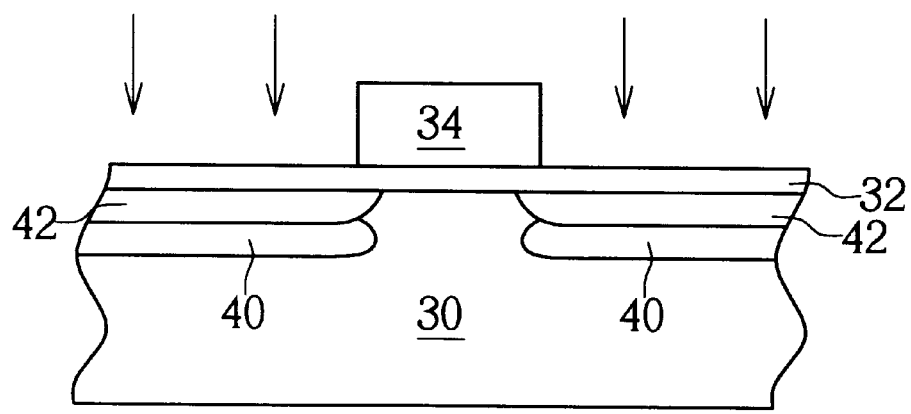

As shown in FIG. 8, a first RTA process is performed to activate dopants in the pocket implant region 40 as well as to prevent the TED effects. Following that, a second ion implantation process is performed using p-type dopants, such as boron or $BF_2^{30}$ ions, to form a source/drain extension doping region 42 within the semiconductor substrate 30 adjacent to the gate 34. An implantation energy of the second ion implantation process ranges from 2 to 3 KeV, while an implantation dosage of the second ion implantation process ranges from $1 \times 10^{15}/cm^2$ to $1 \times 10^{16}/cm^2$.

Figure 9:
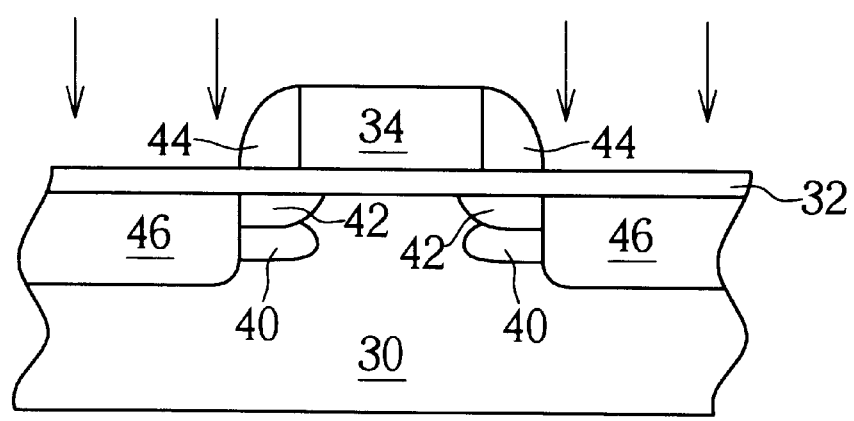

As shown in FIG. 9, a dielectric layer (not shown), such as a silicon nitride layer, is uniformly deposited on the surfaces of the gate 34 and the semiconductor substrate 30. Thereafter, an anisotropic etching process is performed to etch back the dielectric layer and leave a portion of the dielectric layer on either side of the gate 34 so as form a spacer 44. Alternatively, the spacer 44 can be an oxide layer, such as a TEOS layer.

An extra thermal treatment lasting thirty minutes at a temperature of 680° C. is required so as to densify the TEOS spacer 44.

After that, still referring to FIG. 9, a third ion implantation process is performed with p-type dopants, such as boron ions, to form a source/drain doping region 46 within the semiconductor substrate 30 outside of the spacer 44. An implantation energy of the third ion implantation process is approximately 5 KeV while an implantation dosage of the third ion implantation process is approximately $1 \times 10^{15}/cm^2$. Finally, a second RTA process is performed to activate the dopants within the source/drain extension doping region 42 and the source/drain doping region 46, thus finishing the fabrication of the PMOS device with the ultra-shallow junction extension regions.

Figure 10:
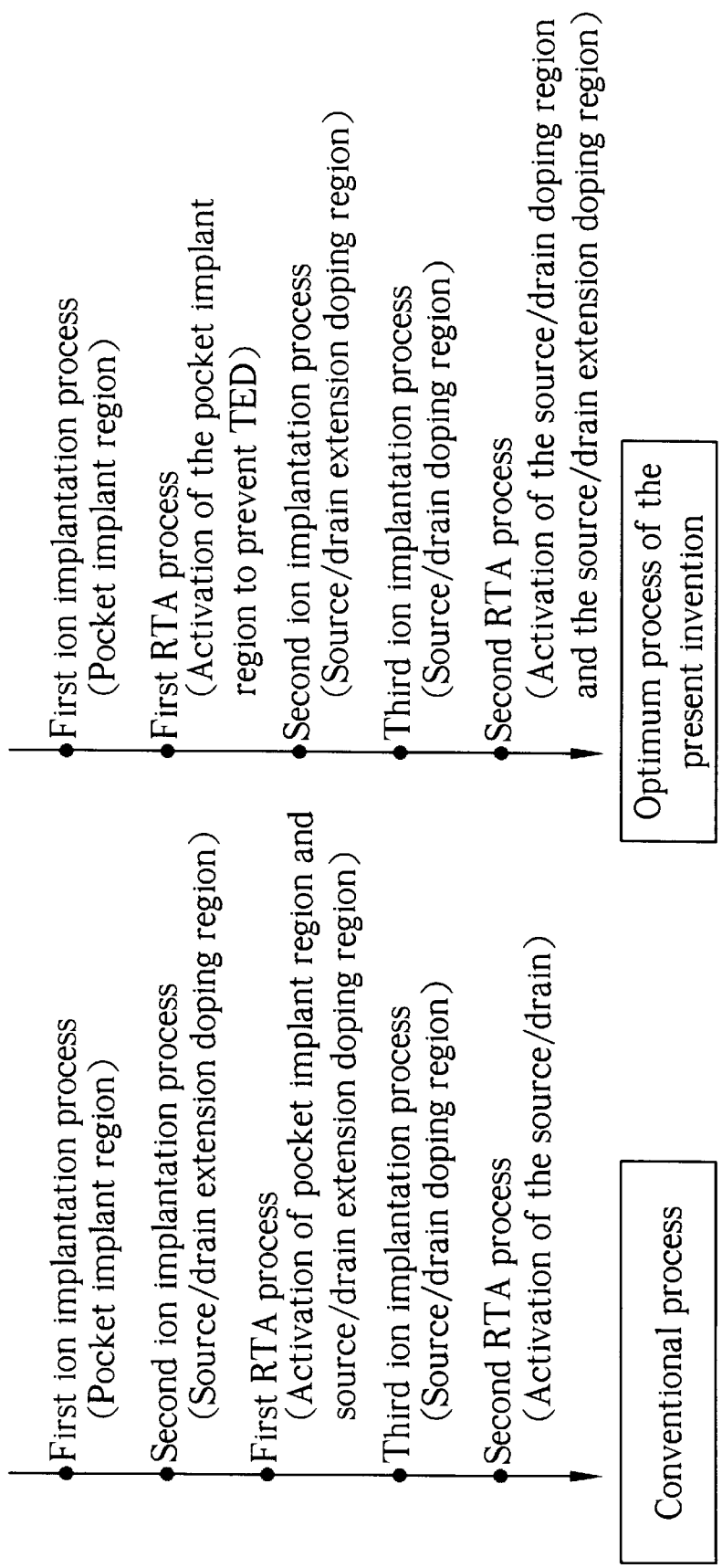
FIG. 10 is a schematic diagram of the processes of the present invention in comparison with the processes of the prior art.

As shown in FIG. 10, a schematic diagram of the processes of the present invention in comparison with the processes of the prior art is provided. Therein, the first RTA process of the present invention is performed immediately after the pocket implant region 40 is formed by the first ion implantation process, such as to distinguish the processes of the present invention from that of the prior art. According to the present invention, a phase-in heating method with a heating rate of 25° C./s, 50° C./s and 75° C./s respectively, is used to raise the temperature in the first RTA process. Following that, a heating time less than 10 seconds at an effectively constant temperature of 1000° C. is used to rapidly anneal the semiconductor substrate 30, so as to activate the pocket implant region 40 and repair damages on the crystal lattice structure resulting from the high-energy ions in the pocket implant region 40. As a result, the TED effects are prevented from affecting the junction depth of the source/drain extension doping region 42 that is formed in later processes.

Figure 11:
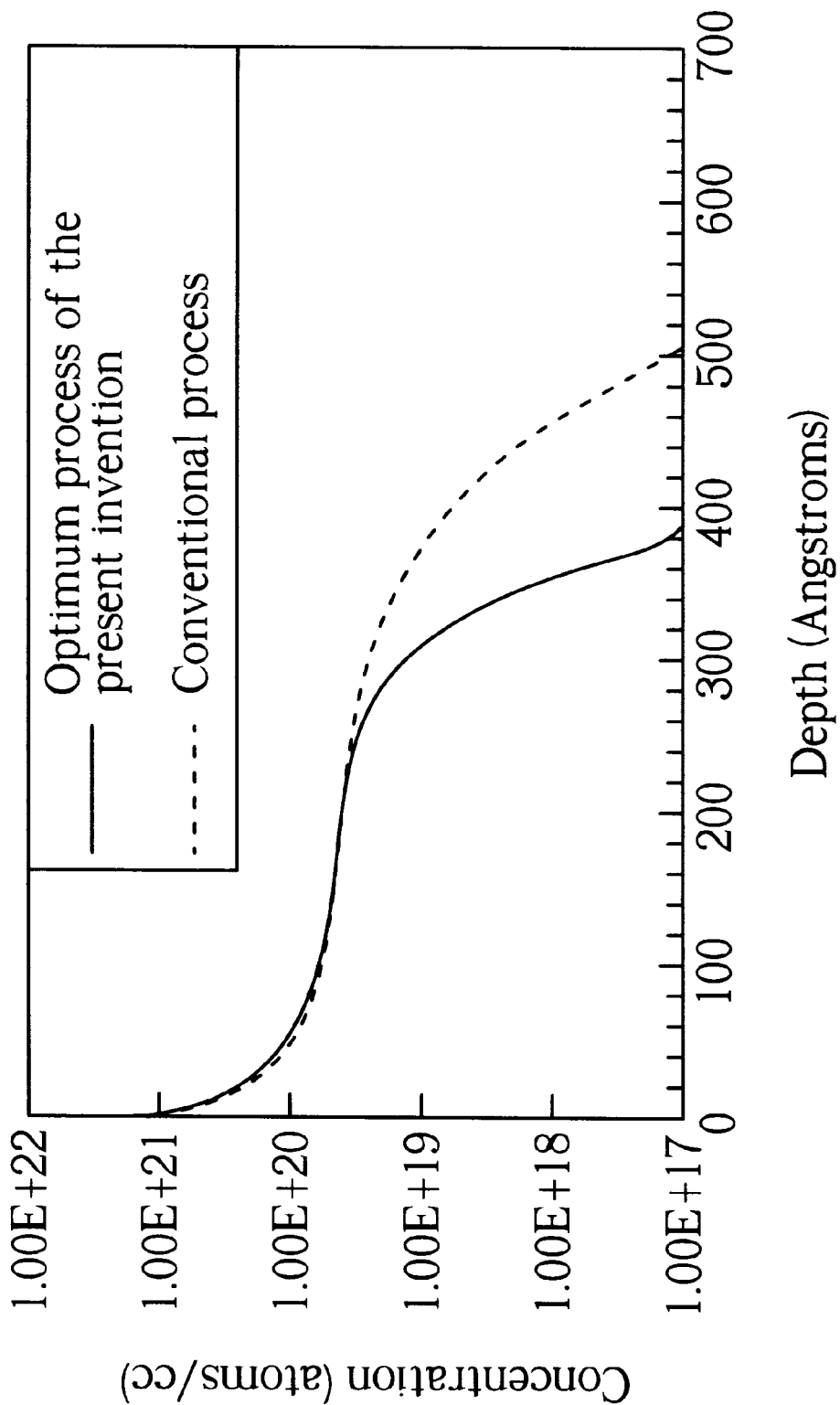
FIG. 11 is a comparison diagram of a junction depth made by the processes of the present invention and the processes of the prior art.

Subsequently, according to the processes of the present invention and the processes of the prior art, as shown in FIG. 10, the same process parameters including the ion implantation energy, implantation dosage, heating temperature and time of the RTA processes are used to form a comparison diagram of a junction depth as shown in FIG. 11. Wherein, a vertical axis expresses an implantation dosage of the second ion implantation to form the source/drain extension doping region, and a horizontal axis expresses a junction depth of the source/drain extension region.

Referring to FIG. 11, and taking the implantation dosage as $1 \times 10^{18}$ atoms/cc, the processes of the present invention produces a junction depth of 350 Å. However, using the same implantation dosage, the processes of the prior art produces a junction depth of 450 Å.

In addition, the processes of the present invention may also be applied to form an ultra-shallow extension region of a NMOS transistor such as to attain a junction depth less than 300 Å.

In contrast to the prior art of forming a shallow junction functioning as a source extension region or a drain extension region of a MOS transistor, the method of the present invention performs a RTA process immediately after the high-energy pocket implantation process. Using the RTA process, ions within the semiconductor substrate are activated and damages from the pocket implantation process to the crystal lattice structure are repaired. As a result, TED effects of the high-energy ions in the pocket implant region are prevented from affecting the junction depth of the source extension and the drain extension in subsequent thermal processes. In addition, since the junction depth is effectively decreased without lowering the ion implantation energy in the present invention, time delay and higher cost incurred by lowering the ion implantation energy as in the prior art are completely prevented.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a MOS device with an ultra-shallow junction (USJ) as a source extension or a drain extension, the method comprising:

providing a semiconductor substrate, the semiconductor substrate comprising at least a gate;

performing a first ion implantation process to form a pocket implant region of a first conductive type within the semiconductor substrate beneath the gate;

performing a first rapid thermal annealing (RTA) process immediately after the first ion implantation process to reduce transient enhanced diffusion (TED) effects resulting from the first ion implantation process; and performing a second implantation process to form a source extension doping region and a drain extension doping region of a second conductive type within the semiconductor substrate adjacent to the gate;

wherein the first ion implantation process uses an implantation energy that greater than an implantation energy of the second ion implantation process.

2. The method of claim 1 wherein the MOS device is a PMOS device, a depth of the source/drain extension of the PMOS device being less than 400 angstroms (Å).

3. The method of claim 1 wherein the MOS device is an NMOS device, a depth of the source/drain extension of the NMOS device being less than 300 angstroms (Å).

4. The method of claim 1 wherein the first RTA process comprises a heating time that is less than 10 seconds at an effectively constant temperature of 1000° C.

5. The method of claim 1 wherein after the second ion implantation process the method further comprises:

forming a spacer on opposite sides of the gate;

performing a third ion implantation process to form a source doping region and a drain doping region within the semiconductor substrate adjacent to the gate; and performing a second RTA process to activate dopants in the source/drain extension doping region and the source/drain doping region.

6. The method of claim 1 wherein the MOS device is a PMOS device, and arsenic (As) ions are used in the first ion implantation process with an implantation energy of 60 to 80 KeV.

7. The method of claim 1 wherein the MOS device is a PMOS device, and $BF_2$ ions are used in the second ion implantation process with an implantation energy of 2 to 3 KeV.

8. The method of claim 5 wherein the MOS device is a PMOS device, and boron ions are used in the third ion implantation process with an implantation energy of 5 KeV.

9. A method of fabricating a MOS device with an ultra-shallow junction (USJ) as a source extension or a drain extension, the method comprising;

providing a semiconductor substrate, the semiconductor substrate comprising at least a gate;

performing a first ion implantation process to form a pocket implant region within the semiconductor substrate beneath the gate;

performing a first rapid thermal annealing (RTA) process immediately after the first ion implantation process to reduce transient enhanced diffusion (TED) effects resulting from the first ion implantation process;

performing a second implantation process to form a source extension doping region and a drain extension doping region within the semiconductor substrate adjacent to the gate;

forming a spacer on opposite sides of the gate;

performing a third ion implantation process to form a source doping region and a drain doping region within the semiconductor substrate adjacent to the gate; and performing a second RTA process to activate dopants in the source/drain extension doping region and the source/drain doping region.

10. The method of claim 9 wherein the MOS device is a PMOS device, a depth of the source/drain extension of the PMOS device being less than 400 angstroms (Å).

11. The method of claim 9 wherein the MOS device is an NMOS device, adepth of the source/drain extension of the NMOS device being less than 300 angstroms (Å).

12. The method of claim 9 wherein the first RTA process comprises a heating time that is less than 10 seconds at an effectively constant temperature of 1000° C.

13. The method of claim 9 wherein the MOS device in a PmOS device, and arsenic (As) ions are used in the first ion implantation process with an implantation energy of 60 to 80 KeV.

14. The method of claim 9 wherein the MOS device is a PMOS device, and $BF_2$ ions are used in the second ion implantation process with an implantation energy of 2 to 3 KeV.

15. The method of claim 9 wherein the MOS device is a PMOS device, and boron ions are used in the third ion implantation process with an implantation energy of 5 Kev.

* * * * *